United States Patent
Lee et al.

(10) Patent No.: US 6,653,028 B2
(45) Date of Patent: Nov. 25, 2003

(54) PHOTO MASK FOR FABRICATING A THIN FILM TRANSISTOR LIQUID CRYSTAL DISPLAY

(75) Inventors: Deuk Su Lee, Kyoungki-do (KR); Jung Mok Jun, Seoul (KR)

(73) Assignee: Boe-Hydis Technology Co., Ltd., Kyoungki-do (KR)

( * ) Notice: Subject to any disclaimer, the term of this patent is extended or adjusted under 35 U.S.C. 154(b) by 78 days.

(21) Appl. No.: 09/870,978

(22) Filed: May 31, 2001

(65) Prior Publication Data

US 2001/0049064 A1 Dec. 6, 2001

(30) Foreign Application Priority Data

May 31, 2000 (KR) .......................... 2000-29775

(51) Int. Cl.[7] .................................. G03F 9/00
(52) U.S. Cl. .................. 430/5; 430/5; 430/30; 438/148
(58) Field of Search .............. 430/5, 30; 438/148, 438/159, 163

(56) References Cited

U.S. PATENT DOCUMENTS

| | | | |
|---|---|---|---|
| 4,902,899 A | * | 2/1990 | Lin et al. ............... 250/492.1 |
| 5,543,254 A | * | 8/1996 | Kim et al. ................... 430/5 |
| 5,636,002 A | * | 6/1997 | Garofalo .................... 355/53 |
| 5,821,014 A | * | 10/1998 | Chen et al. ................. 430/30 |
| 6,165,693 A | * | 12/2000 | Lin et al. .................. 430/311 |
| 2002/0094492 A1 | * | 7/2002 | Randall et al. ............ 430/311 |

\* cited by examiner

*Primary Examiner*—Mark F. Huff
*Assistant Examiner*—Kripa Sagar
(74) *Attorney, Agent, or Firm*—Ladas & Parry

(57) ABSTRACT

The present invention discloses a photo mask employing in a TFT-LCD fabrication using 4-mask process. The disclosed photo mask comprises a transparent substrate and a shielding pattern formed thereon, wherein the shielding pattern includes a pair of first shielding patterns each having the rectangular shape disposed with separation to cover source and drain formation regions, a pair of second shielding patterns of a bar type disposed between the first shielding patterns and third shielding patterns of a bar type disposed on lower and upper portions of the first and the second shielding patterns to make a clear division between a light transmittance region and a light shielding region on the edge of a channel region.

12 Claims, 10 Drawing Sheets

PHOTO MASK FOR FABRICATING A THIN FILM TRANSISTOR LIQUID CRYSTAL DISPLAY

BACKGROUND OF THE INVENTION

1. Field of the Invention

The present invention relates to a thin film transistor liquid crystal display, and more particularly a photo mask for fabricating a thin film transistor liquid crystal display using 4-mask process.

2. Description of the Related Art

Thin Film Transistor Liquid Crystal Display (hereinafter referred as TFT-LCD) has advantages of light weight, thin thickness and low power consumption. Therefore, it has been substituted for Cathode-ray tube (CRT) in a terminal of information system and video unit, etc. and recently, it is widely used in a notebook PC and a computer monitor market.

This TFT-LCD comprises a TFT array substrate which has a structure that TFT is disposed on each pixel arranged in a matrix shape, a color filter substrate which has a structure that red, green and blue color filters are arranged correspondingly to each pixel, and a liquid crystal layer interposed between the substrates.

In fabrication of the TFT-LCD, it is very important to reduce the number of fabrication processes, particularly, the number of TFT array substrate fabrication processes. This is because reduction of fabrication processes lowers production cost, thereby increasing the TFT-LCD supply with a low price.

In order to reduce fabrication processes, it is necessary to reduce the number of photolithography processes and it is realized by reducing the number of photo mask used in the processes. Recently, photo masks of 5 to 7 sheets are used for fabricating TFT-LCD, and photo masks of 4 sheets may be used in some cases.

FIGS. 1A to 1E are cross-sectional views for showing a conventional method of fabricating a TFT array substrate using photo masks of 4 sheets. TFT formation parts are illustrated in the drawings.

Referring to FIG. 1A, a gate metal layer is deposited on a glass substrate (1), and then a gate line (not shown) including a gate electrode (2) is formed by patterning with a mask process using a first photo mask. A gate insulating layer (3), an a—Si layer (4), a n+ a—Si layer (5), a source/drain metal layer (6) and a sensitive layer (7) are sequentially formed on the glass substrate including the gate electrode.

Referring to FIG. 1B, the sensitive layer (7) is exposed using a second photo mask and the exposed sensitive layer is then developed, thereby forming a sensitive layer pattern (7a) to cover a channel unit and source/drain formation regions. The sensitive layer pattern (7a) is formed by half tone exposure and the center thereof, that is, a part to cover a TFT channel formation region, is thinner than parts to cover source/drain formation regions.

According to the half tone exposure, each region is exposed to different exposure degree, so that a photoresist pattern has uneven thickness. In this process, the exposure degree may be controlled by designing a photo mask.

FIGS. 2A and 2B are respectively a cross sectional view and a plane view generally illustrating a photo mask for the half tone exposure process. As shown in FIGS. 2A and 2B, a photo mask (20) for the halftone exposure comprises a light transmission substrate (11) and a shielding pattern (12). In addition to a light transmission region (A) and a light shielding region (B), a semi-permeable region (C) is included, which semi-permeable region transmits light at lower degree than that transmitted by the light transmittance region (A).

The resolution of a stepper as an exposure device is 3 $\mu$m. Therefore, when fine patterns with resolution lower than that of the exposure device are formed on the transparent substrate (11), the degree of exposure is lowered in the formation region of the fine patterns, thereby the sensitive layer pattern corresponding to this region has a lesser thickness when compared to other regions.

Referring to FIG. 1C, source/drain metal layers are etched using the sensitive layer pattern (7a) as an etching mask to form a data line.

Referring to FIG. 1D, n+ a-Si layer (5) and a-Si layer (4) are etched using the sensitive layer pattern (7a) as an etching mask to define an active region, and subsequently, source/drain (6a, 6b) are formed by etching source/drain metal layer disposed on the channel region. That is, while the n+ a-Si layer and the a-Si layer are etched, center of the sensitive layer pattern (7a) is etched together with the layers due to relatively lesser thickness and the source/drain metal layers of the exposed channel region are also etched to form the source/drain (6a, 6b).

Referring to FIG. 1E, a n+ a—Si layer on the exposed channel region is etched and then, the sensitive layer pattern is removed, thereby completing a TFT (10).

Although it is not shown in drawings, a protective layer is formed using a third photo mask and a pixel electrode is formed using a fourth photo mask. A TFT array substrate is completed through well-known following processes including formation processes of the protective layer and the pixel electrode.

However, a conventional method of fabricating a TFT array substrate has following problems.

As shown in FIG. 3, in half tone exposure, both edges of a channel unit (4a) are flexed or diffracted by interference of light since there is no clear division between a light transmittance region and a light shielding region at the edge of channel region. When edges of the channel unit (4a) are diffracted, a path of On-current is diffracted at the diffracted edges of channel unit (4a), thereby causing deterioration in the quality of the TFT-LCD screen.

SUMMARY OF THE INVENTION

Therefore, an object of the present invention is to provide a photo mask for fabricating TFT-LCD which can prevent diffraction at both edges of the channel region in halftone exposure.

In order to achieve the above object, a photo mask for fabricating TFT-LCD according to an embodiment of the present invention comprises a transparent substrate and a shielding pattern formed thereon, wherein the shielding pattern includes: a pair of first shielding patterns each having the rectangular shape disposed with separation therebetween to cover a source and a drain formation regions; a pair of second shielding patterns each having the longitudinal shape of the bar disposed between the first shielding patterns; and third shielding patterns each having the longitudinal shape of the bar being tansversely disposed adjacent upper and lower portions of the first and second shielding patterns to divide a light transmittance region and light shielding region at the edges of a channel region.

BRIEF DESCRIPTION OF THE DRAWINGS

The above objects, and other features and advantages of the present invention will become more apparent after a reading of the following detailed description when taken in conjunction with the referenced drawings.

DETAILED DESCRIPTION OF THE INVENTION

Figure 1A:
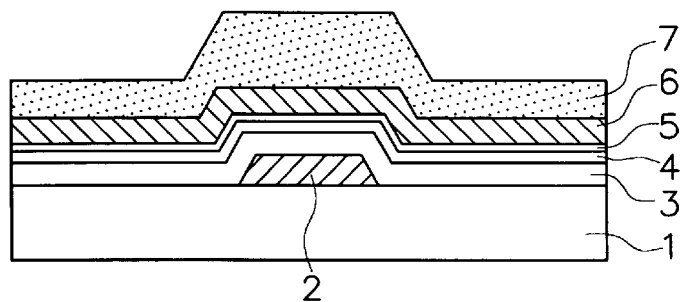
FIGS. 1A to 1E are cross-sectional views for showing a conventional method of fabricating a TFT array substrate using 4 photo masks.
Figure 1B:
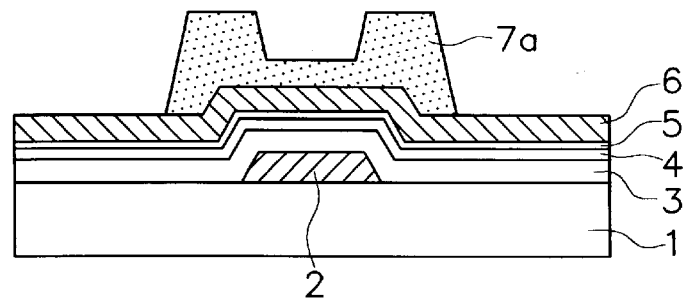
Figure 1C:
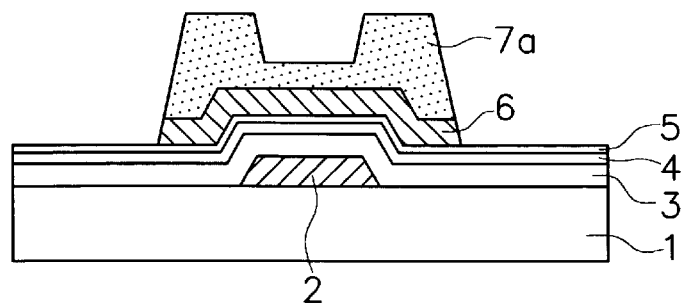
Figure 1D:
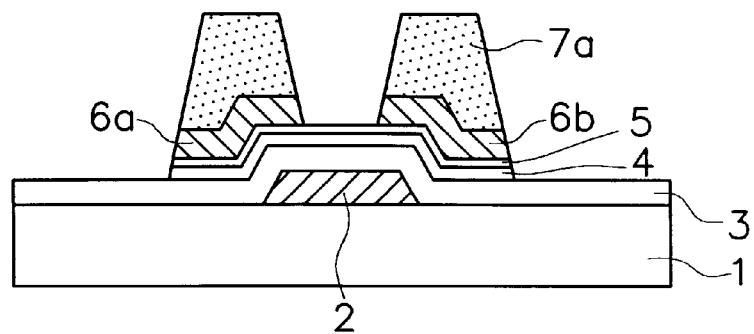
Figure 1E:
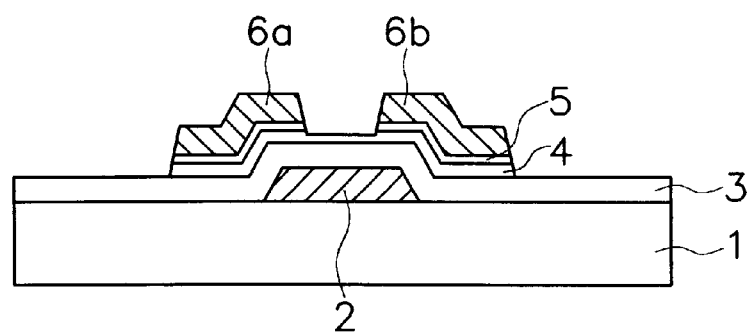
Figure 2A:
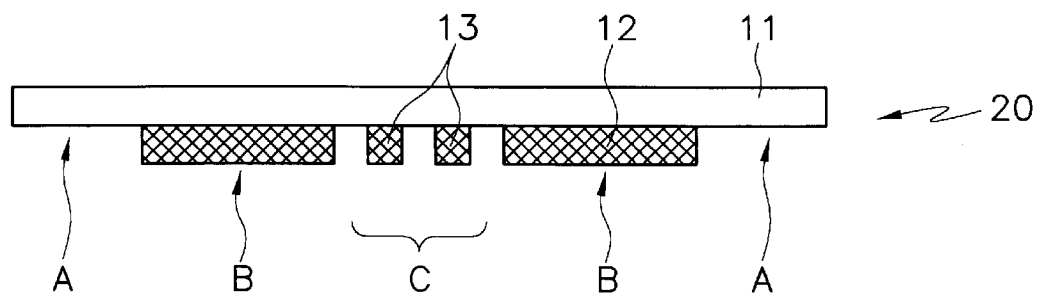
FIGS. 2A and 2B are a plane view and a cross sectional view illustrating a conventional photo mask for half tone exposure process.
Figure 2B:
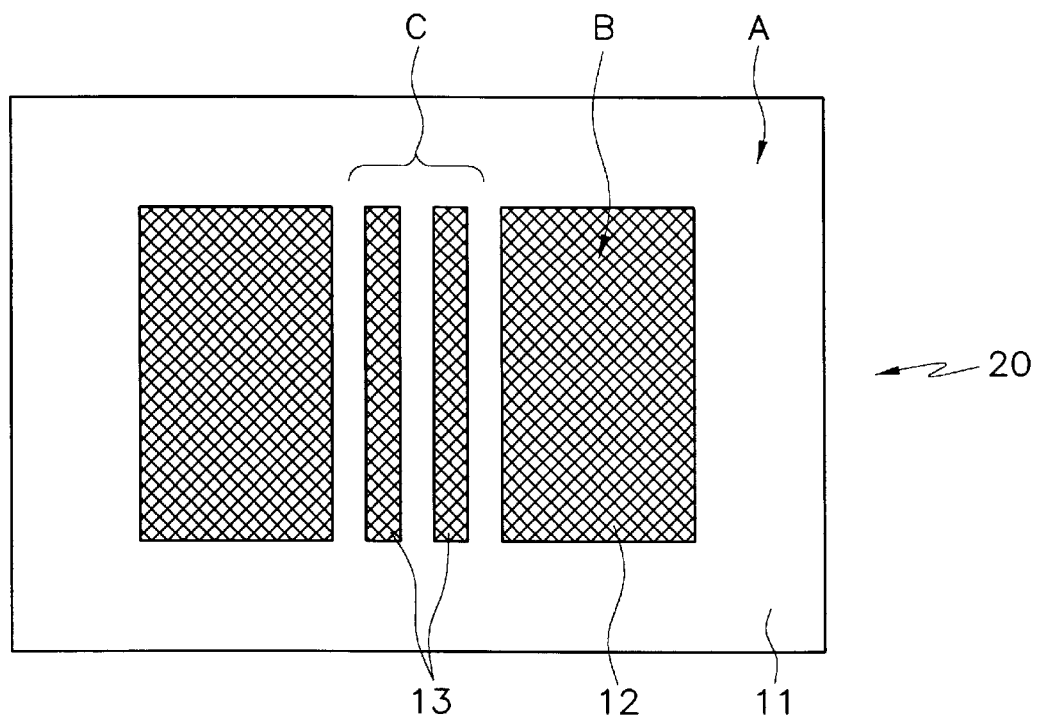
Figure 3:
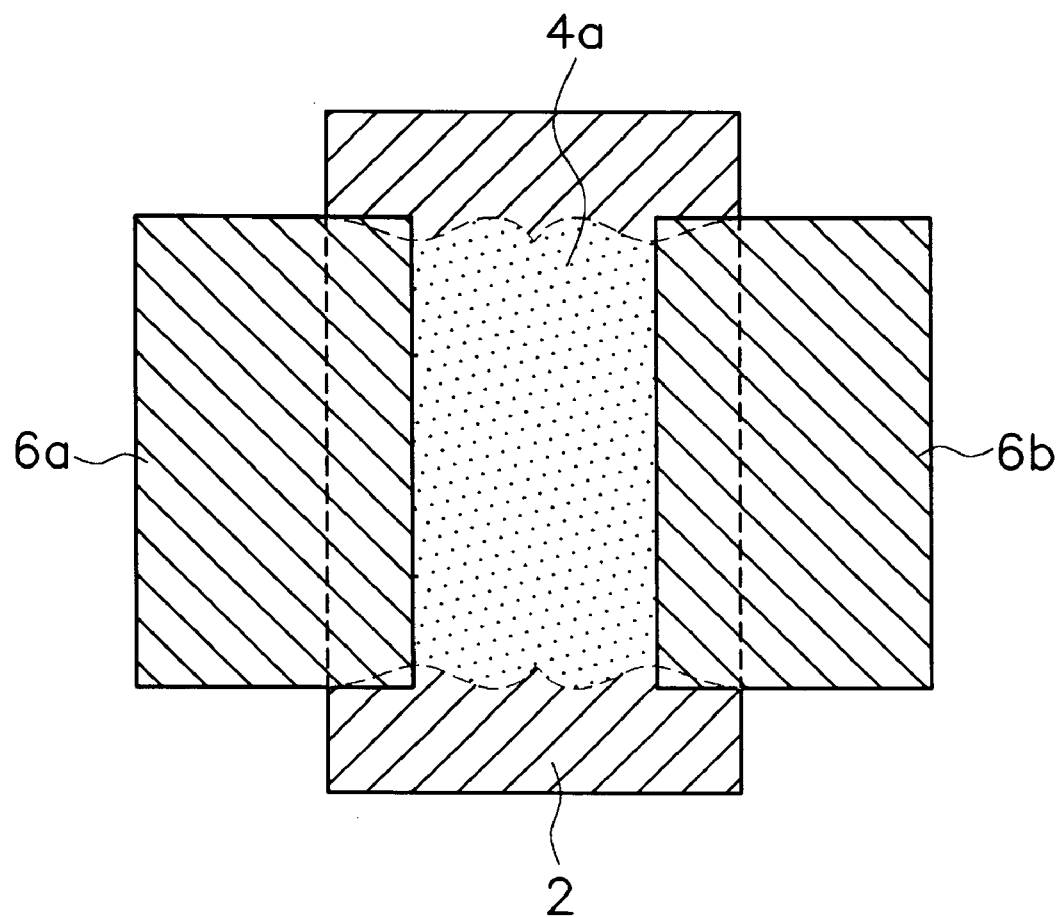
FIG. 3 is a plane view of main parts for showing a conventional problem.
Figure 4:
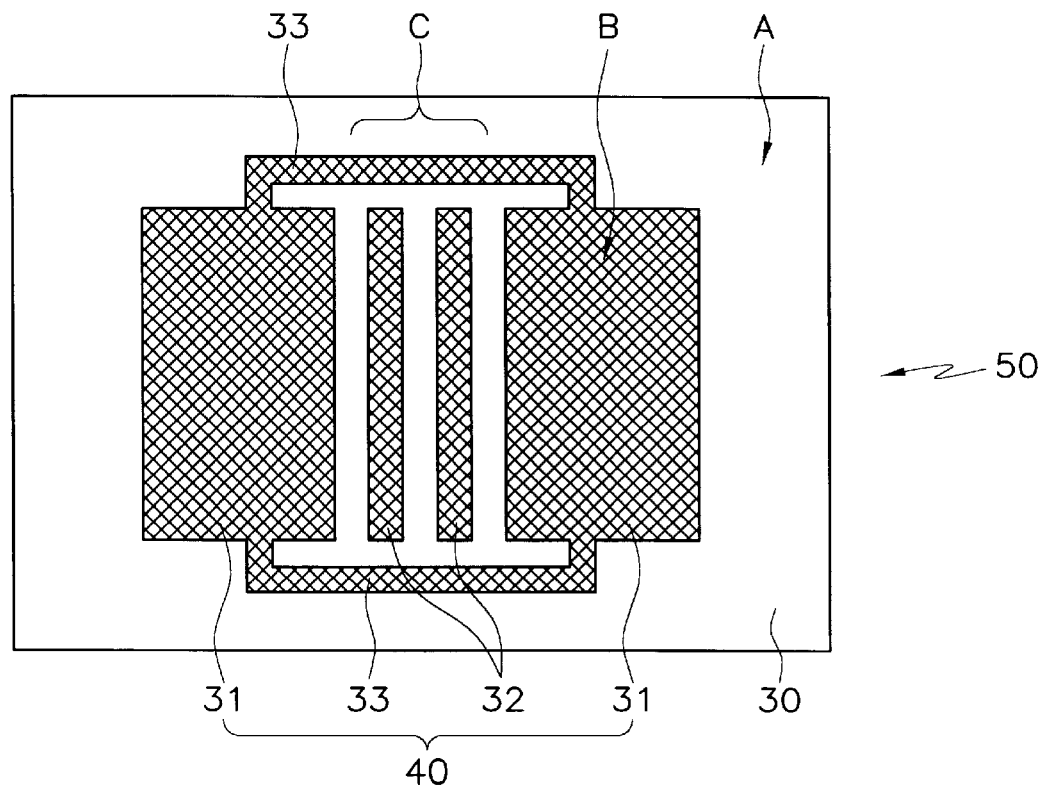
FIG. 4 is a plane view illustrating a photo mask for fabricating TFT LCD according to a preferred embodiment of the present invention.

FIG. 4 is a plane view illustrating a photo mask for fabricating a TFT LCD according to the present invention.

As illustrated, a photo mask (50) of the present invention comprises a transparent substrate (30) and a light shielding pattern (40) formed on the transparent substrate (30). The light shielding pattern (40) includes a pair of first shielding patterns (31) each having the rectangular shape disposed with a separation therebetween to cover source/drain formation regions, a pair of second shielding patterns (32) each having the longitudinal shape of a bar disposed between the first shielding patterns (31), and third shielding patterns (33) each having the longitudinal shape of the bar and being transversely disposed adjacent upper and lower portions of the first shielding patterns (31). The third shielding pattern (33), for example, has a width of less than 1 μm, and the both edges thereof are connected to the sides of the first shielding patterns (31), but not to the second shielding patterns (32).

In this photo mask (50), the shielding pattern (40) services as a shielding region (B) and the region between the first shielding patterns (31) including the second shielding patterns (32) operates as a semi-permeable region (C). And, the region of the remaining transparent substrate (30) except the shielding pattern region (40) services as a light transmittance region (A).

Figure 5:
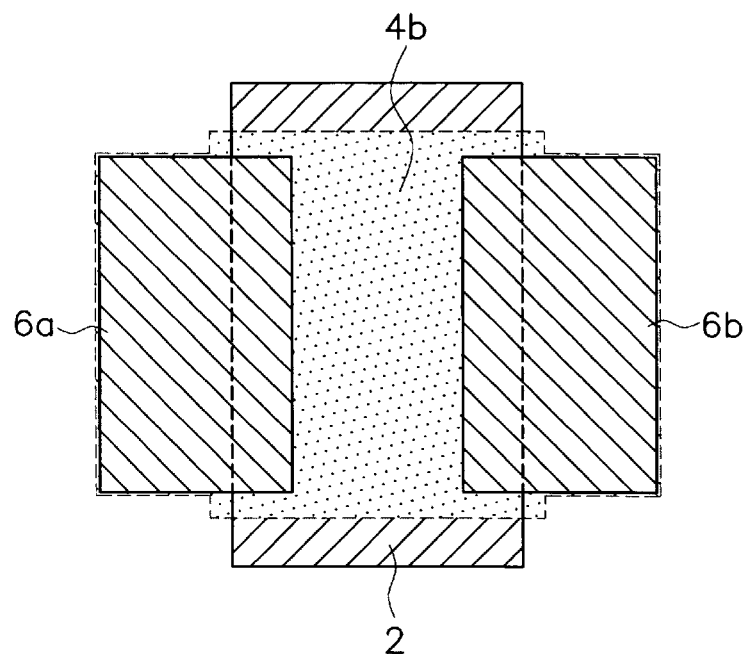
FIG. 5 is a plane view of a channel region of TFT using the photo mask in FIG. 4.

FIG. 5 is a plane view of a channel region of a TFT obtained using a photo mask according to an embodiment of the present invention. As illustrated, diffraction does not occur at the edges of channel unit (4b) by disposing a third shielding pattern on the photo mask in order to clearly divide the light transmittance region and light shielding region, and thereby enlarging the channel region.

Therefore, path diffraction of the On-current is not caused at the edges of channel unit (4b) and the channel width is sufficiently ensured, thereby preventing degradation of TFT-LCD.

FIGS. 6A to 6E are plane views of photo masks for fabricating TFT-LCD according to other embodiments of the present invention. In the drawings, shielding patterns are illustrated and transparent substrates are omitted. There is no repeated explanation for the same parts as those in FIG. 4.

Figure 6A:
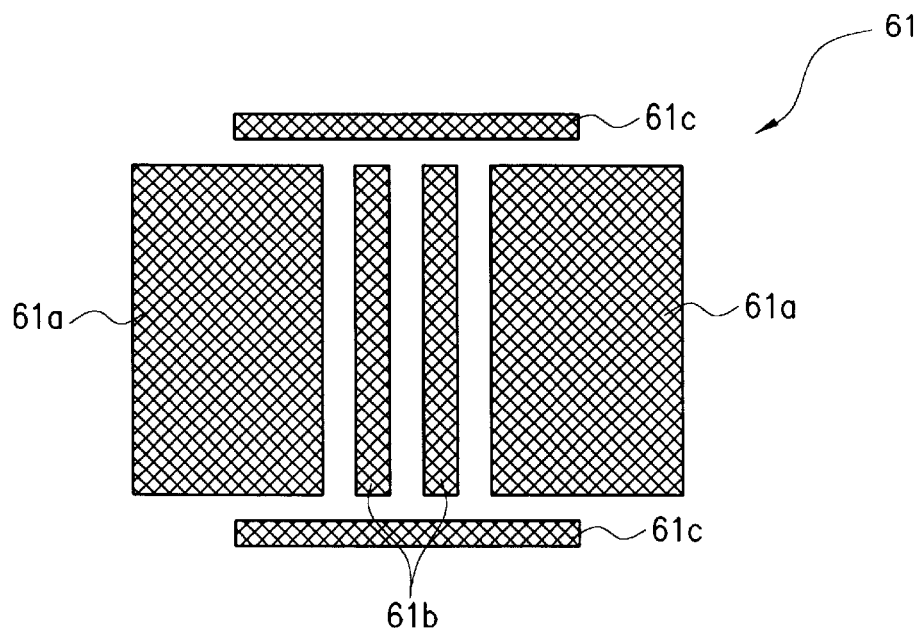
FIGS. 6A to 6E are plane views illustrating photo masks for fabricating TFT LCD according to other embodiments of the present invention.

Referring to FIG. 6A, a shielding pattern (61) has a structure that third shielding patterns (61c) are formed in a bar type, whose edges are not connected to either first shielding patterns (61a) and second shielding patterns (61b).

Figure 6B:
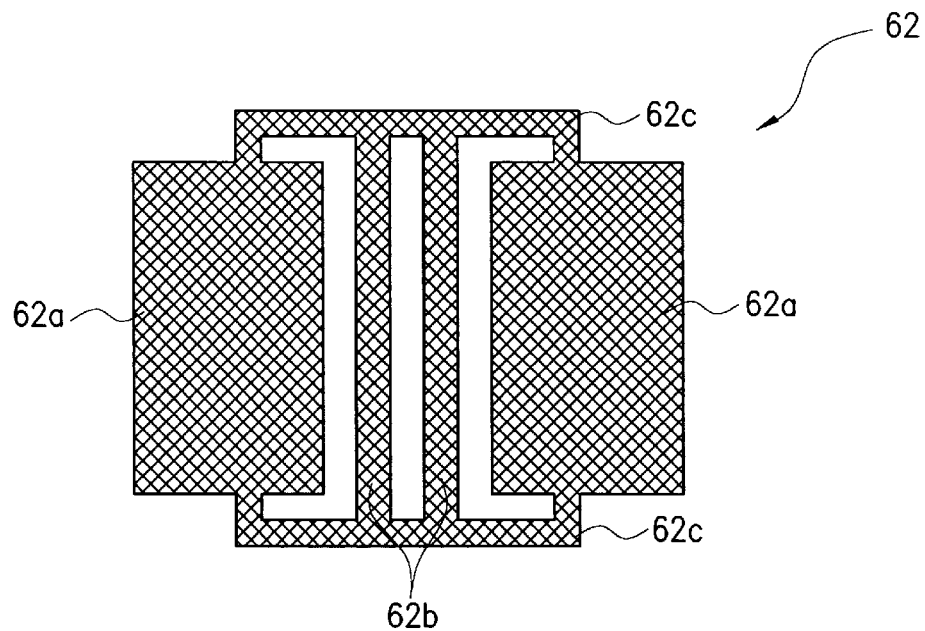

Referring to FIG. 6B, a shielding pattern (62) has a structure that third shielding patterns (62c) are formed in a bar type, whose edges are connected to both first shielding patterns (62a) and second shielding patterns (62b).

Figure 6C:
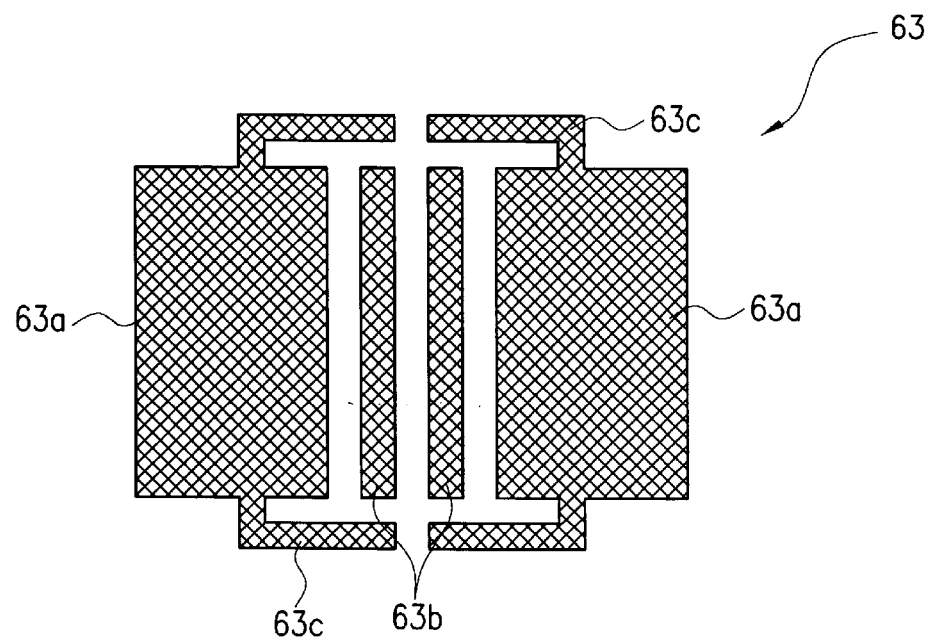

Referring to FIG. 6C, a shielding pattern (63) has a structure that third shielding patterns (63c) are connected to first shielding patterns (63a) and separated from second shielding patterns (63b).

Figure 6D:
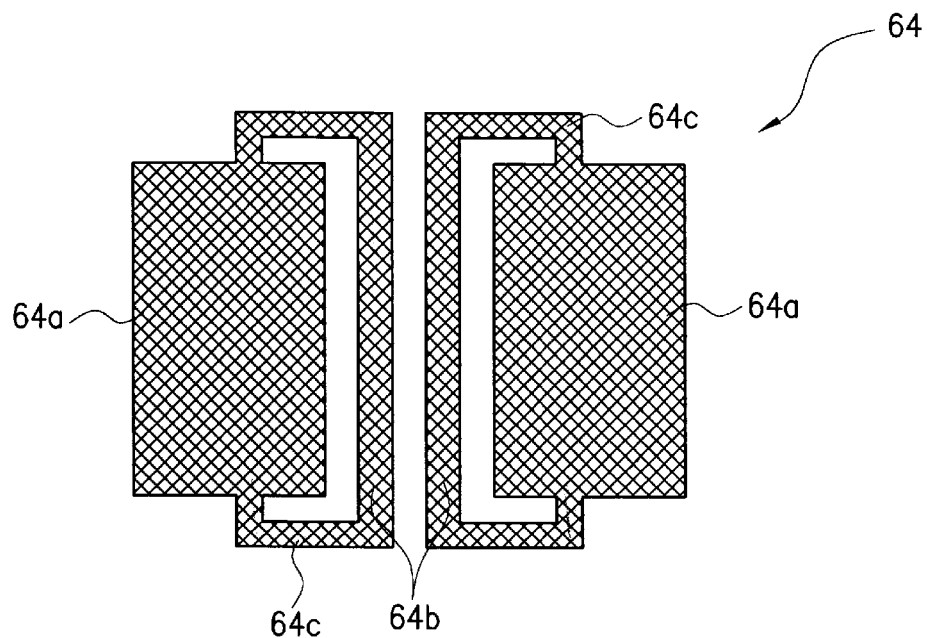

Referring to FIG. 6D, a shielding pattern (64) has a structure that third shielding patterns (64c) connect one side of first shielding patterns (64a) and edges of second shielding patterns (64b).

Figure 6E:
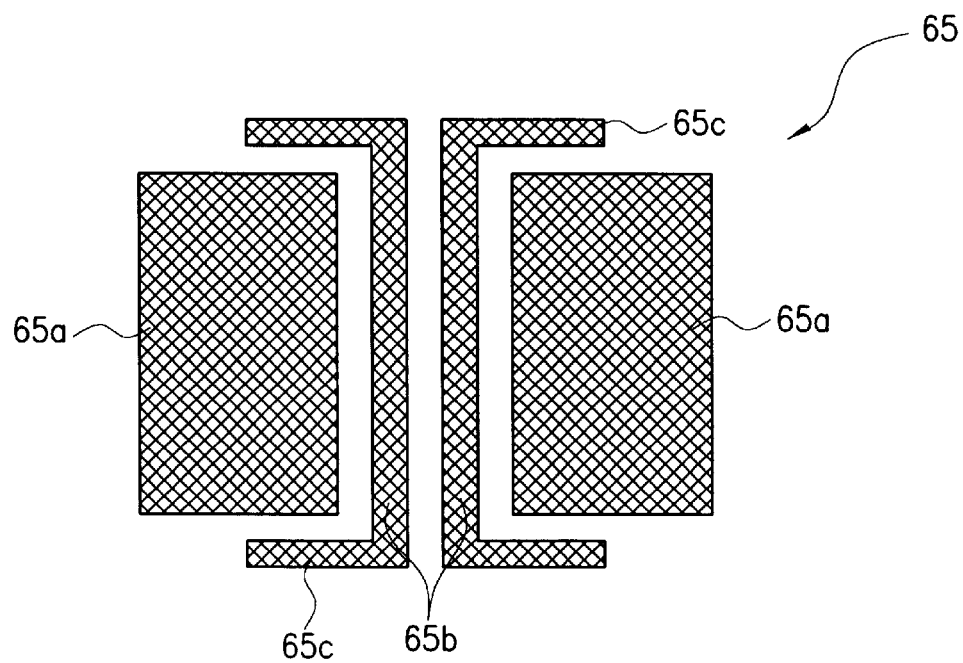
Figure 7A:
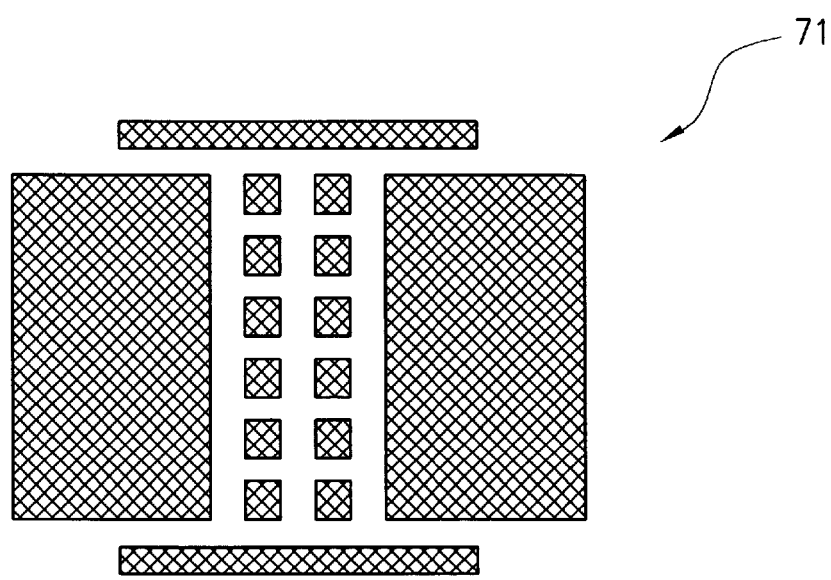
FIGS. 7A to 7E are plane views illustrating photo masks for fabricating TFT LCD according to other embodiments of the present invention.
Figure 7B:
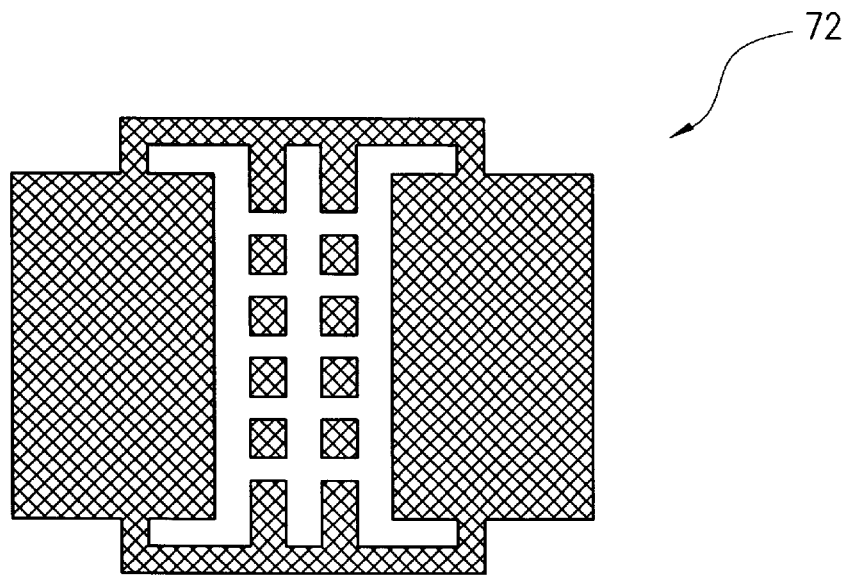
Figure 7C:
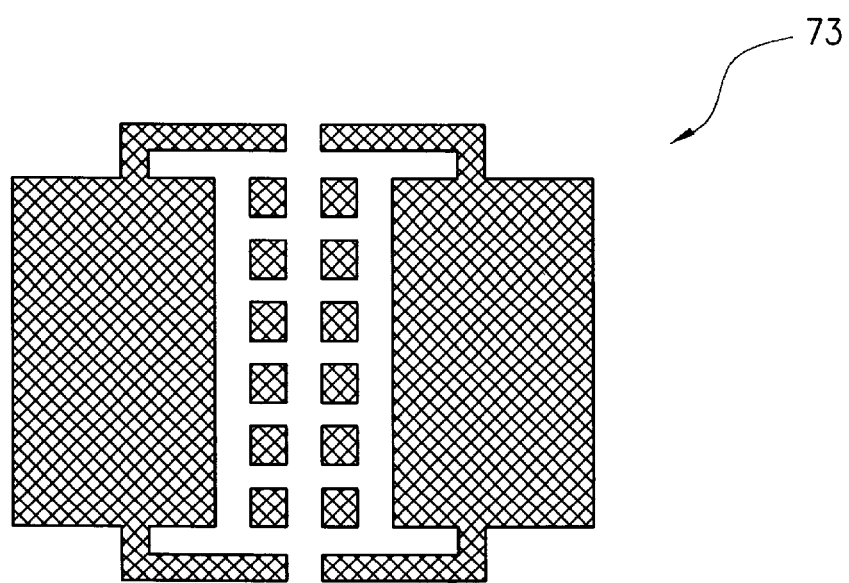
Figure 7D:
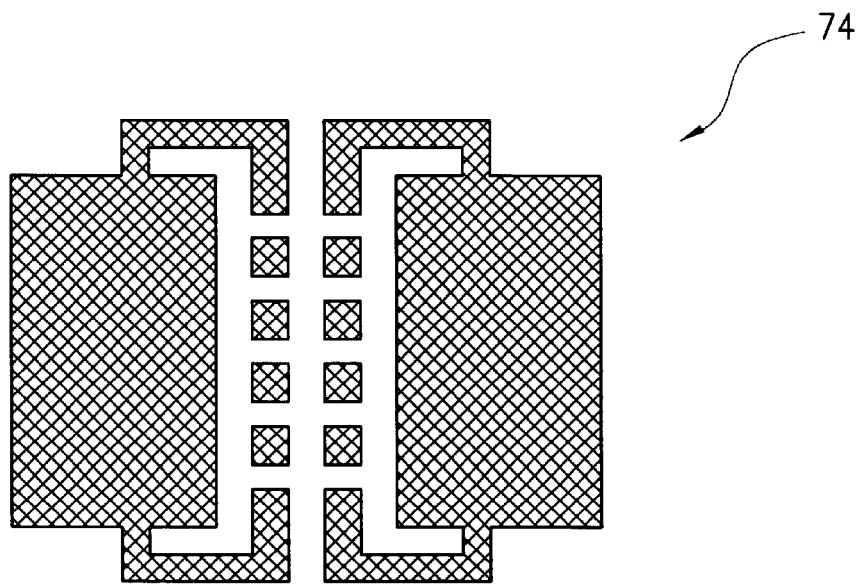
Figure 7E:
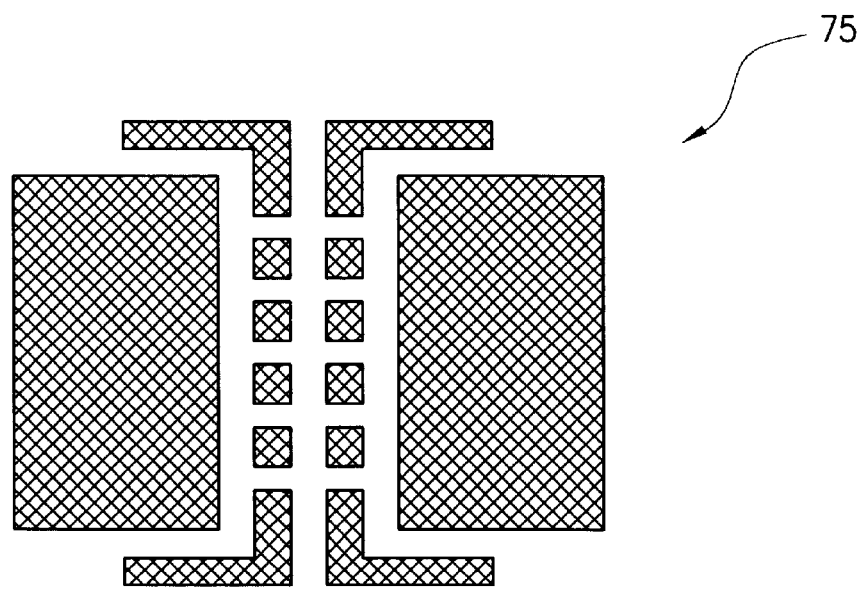

Referring to FIG. 6E, a shielding pattern has a structure that third shielding patterns (65c) are connected to edges of second shielding patterns (65b) and separated from first shielding patterns (65a).

FIGS. 7A to 7E are plane views illustrating photo masks for fabricating TFT-LCD according to other embodiments of the present invention.

In the drawings, shielding patterns (71,72,73,74,75) have the same structures as those of shielding patterns (61,62,63, 64,65) in FIGS. 6A to 6E. except that the second shielding patterns are formed not in a bar type, but in a dot type. Therefore, there is no repeated explanation about FIGS. 7A to 7E.

As described above in the context of an embodiment of the present invention, a shielding pattern is additionally provided on the edges of a TFT channel unit in order to clearly divide a light transmittance region and a light shielding region, and thereby to ensure a stable channel width. Accordingly, the On-current of the TFT is stabilized. As a result, the screen quality of TFT-LCD is improved.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A photo mask for fabricating a TFT-LCD comprising:
   a transparent substrate and a shielding pattern formed thereon, wherein the shielding pattern includes a pair of first shielding patterns each having a rectangular shape disposed with separation therebetween in order to cover source/drain formation regions;
   a pair of second shielding patterns each having the longitudinal shape of a bar and being longitudinally disposed between the first shielding patterns; and
   third shielding patterns each having the longitudinal shape of the bar and being transversely disposed relative to and adjacent lower and upper portions of the first and the second shielding patterns in order to clearly divide a light transmittance region and a light shielding region at the edge of a channel region.

2. The photo mask for fabricating a TFT-LCD according to claim 1, wherein the second shielding pattern has a structure in which the bars comprise dot-shaped patterns.

3. The photomask for fabricating a TFT-LCD according to claim 1, wherein both ends of each bar of the third shielding pattern are connected to one side of the first shielding pattern and separated from the second shielding pattern.

4. The photomask for fabricating a TFT-LCD according to claim 3, wherein the second shielding pattern has a structure in which the bars comprise dot-shaped patterns.

5. The photomask for fabricating a TFT-LCD according to claim 1, wherein both ends of each bar of the third shielding pattern are connected to one side of the first shielding pattern and at the same time connected to the second shielding pattern.

6. The photomask for fabricating a TFT-LCD according to claim 5, wherein the second shielding pattern has a structure in which the bars comprise dot-shaped patterns.

7. The photo mask for fabricating a TFT-LCD according to claim 3, wherein the third shielding pattern has a separated structure.

8. The photomask for fabricating a TFT-LCD according to claim 7, wherein the second shielding pattern has a structure in which the bars comprise dot-shaped patterns.

9. The photo mask for fabricating a TFT-LCD according to claim 7, wherein a separated edge of the third shielding pattern is connected to an edge of the second shielding pattern.

10. The photomask for fabricating a TFT-LCD according to claim 9, wherein the second shielding pattern has a structure in which the bars comprise dot-shaped patterns.

11. The photo mask for fabricating a TFT-LCD according to claim 1, wherein the third shielding pattern is connected to an edge of the second shielding pattern separated from the first shielding pattern.

12. The photo mask for fabricating a TFT-LCD according to claim 11, wherein the second shielding pattern has a structure in which the bars further comprise dot-shaped patterns.

* * * * *